United States Patent [19]

Inomata et al.

[11] Patent Number: 5,798,201
[45] Date of Patent: Aug. 25, 1998

[54] RADIATION SENSITIVE RESIN COMPOSITION

[75] Inventors: Katsumi Inomata; Nasahiro Akiyama; Toshiyuki Ota; Akira Tsuji, all of Yokkaichi, Japan

[73] Assignees: Japan Synthetic Rubber Co., Ltd., Tokyo; Arakawa Chemical Industries, Ltd., Osaka, both of Japan

[21] Appl. No.: 887,466

[22] Filed: Jul. 2, 1997

Related U.S. Application Data

[62] Division of Ser. No. 538,049, Oct. 2, 1995.

[51] Int. Cl.[6] .................................. G03F 7/023
[52] U.S. Cl. ..................... 430/192; 430/191; 430/193
[58] Field of Search ........................ 430/192, 193, 430/191

[56] References Cited

U.S. PATENT DOCUMENTS

| | | | |
|---|---|---|---|
| 4,992,356 | 2/1991 | Jeffries, III et al. | 430/193 |
| 5,112,719 | 5/1992 | Yamada et al. | 430/193 |
| 5,178,986 | 1/1993 | Zampini et al. | 430/190 |
| 5,288,587 | 2/1994 | Osaki et al. | 430/192 |
| 5,340,688 | 8/1994 | Kawabe et al. | 430/192 |
| 5,364,738 | 11/1994 | Kondo et al. | 430/192 |
| 5,376,497 | 12/1994 | Kawata et al. | 430/191 |
| 5,384,228 | 1/1995 | Doi et al. | 430/192 |
| 5,407,778 | 4/1995 | Uetani et al. | 430/192 |
| 5,407,779 | 4/1995 | Uetani et al. | 430/192 |
| 5,429,904 | 7/1995 | Nagase et al. | 430/192 |
| 5,451,484 | 9/1995 | Nagase et al. | 430/192 |
| 5,468,590 | 11/1995 | Hashimoto et al. | 430/191 |

FOREIGN PATENT DOCUMENTS

| | | |
|---|---|---|
| 3 179353 | 8/1991 | Japan . |
| 4 1650 | 1/1992 | Japan . |
| 4 1652 | 1/1992 | Japan . |
| 5 249665 | 9/1993 | Japan . |
| 5 189333 | 11/1993 | Japan . |

*Primary Examiner*—John S. Chu
*Attorney, Agent, or Firm*—Oblon, Spivak, McClelland, Maier & Neustadt, P.C.

[57] ABSTRACT

A radiation sensitive resin composition containing an alkali soluble resin and a 1,2-quinonediazide compound of a polyphenol or a radiation sensitive resin composition containing an alkali soluble resin and a 1,2-quinonediazide compound and a polyphenol compound.

12 Claims, No Drawings

RADIATION SENSITIVE RESIN COMPOSITION

This is a Division, of application Ser. No. 08/538,049 filed on Oct. 2, 1995, allowed on Jun. 24, 1997.

DETAILED DESCRIPTION OF THE INVENTION

This invention relates to a radiation sensitive resin composition containing an alkali soluble resin. More specifically, it relates to a radiation sensitive resin composition which is suitable for use as a resist for producing a highly integrated circuit, which is sensitive radiation such as ultraviolet ray, far ultraviolet ray, X ray, electron beam, molecular beam, γ-ray, synchrotron radiation, proton beam or the like.

A positive resist is widely used in the production of integrated circuits because a high-resolution resist pattern can be obtained. However, along with recent progress made in the integration of integrated circuits, a positive resist capable of forming a resist pattern having more improved resolution has been desired.

A general method for improving the resolution of a positive resist is to reduce the molecular weight of an alkali soluble resin contained in the resist. However, the method has the problem that the heat resistance of the resist is reduced. An alternative method is to increase the numerical aperture (NA) of a stepper, but this method also has the problem that the focal depth (focus latitude) is narrowed.

With a view to improving the focus latitude, it is conceivable to increase the amount of a quinonediazide compound to be added. However, when the amount of the quinonediazide compound is increased, developability deteriorates. Thus, when one performance is improved, another performance deteriorates.

Therefore, a positive resist which has high resolution, excellent focus latitude and excellent developability of fine patterns is desired.

Japanese Laid-Open Patent Publication No. 3-179353 discloses a radiation sensitive positive resist composition which comprises an alkali soluble resin containing a phenol compound represented by the following formula:

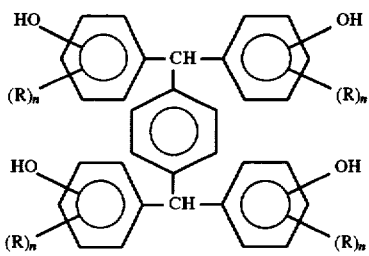

wherein R is an alkyl group or an alkoxyl group, and n is a numeral of 0 to 3, and a 1,2-quinonediazide compound.

Japanese Laid-Open Patent Publication No. 4-1650 discloses a positive resist composition containing a compound represented by the following formula:

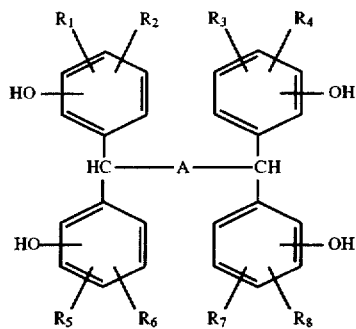

wherein A is selected from the group consisting of an alkylene group, a substituted alkylene group, an alkenylene group, a substituted alkenylene group, an arylene group and a substituted arylene group, $R_1$ to $R_8$ are the same or different from one another and selected from the group consisting of a hydrogen atom, a halogen atom, a $C_1$~$C_4$ alkyl group, a $C_1$~$C_4$ alkoxyl group, a $C_2$~$C_4$ alkenyl group and a hydroxyl group, an alkali soluble phenol resin and a quinonediazide sulfonate photosensitizer.

Japanese Laid-Open Patent Publication No. 4-1652 discloses a positive resist composition containing an alkali soluble phenol resin and as a photosensitizer, a quinonediazide sulfonate represented by the following formula:

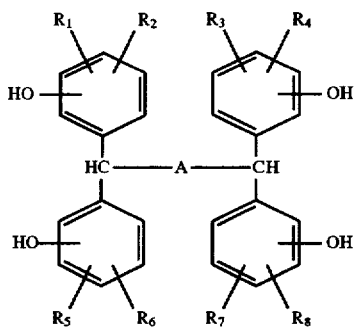

wherein A is selected from the group consisting of an alkylene group, a substituted alkylene group, an alkenylene group, a substituted alkenylene group, an arylene group and a substituted arylene group, $R_1$ to $R_8$ are the same or different from one another and selected from the group consisting of a hydrogen atom, a halogen atom, a $C_1$~$C_4$ alkyl group, a $C_1$~$C_4$ alkoxyl group, a $C_2$~$C_4$ alkenyl group and a hydroxyl group.

Japanese Laid-Open Patent Publication No. 5-249665 discloses a positive photoresist composition containing an alkali soluble resin and an ester compound obtained by reacting 1 mole of a compound represented by the following formula:

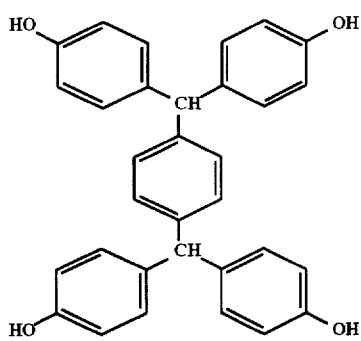

with 2 moles or more of 1,2-naphthoquinonediazide-5-(and/ or 4-)sulfonyl chloride.

However, any of the positive resist compositions disclosed above are not a composition whose sensitivity, resolution, developability, heat resistance and focus latitude are well balanced and yet which has excellent characteristics.

It is therefore an object of the present invention to provide a novel radiation sensitive resin composition.

Another object of the present invention is to provide a radiation sensitive resin composition which is suitable for use as a positive resist which effectively suppresses the generation of scum, exhibits excellent developability and heat resistance and has high resolution.

A further object of the present invention is to provide a radiation sensitive resin composition which is suitable for use as a positive resist which effectively suppresses the generation of scum and has excellent developability and high resolution as well as excellent focus latitude in particular.

Other objects and advantages of the present invention will become more apparent from the following description.

According to the present invention, the above objects and advantages can be attained, firstly, by a radiation sensitive resin composition (to be referred to as "first radiation sensitive resin composition" or "first composition" hereinafter) which comprises an alkali soluble resin and a 1,2-quinonediazide compound represented by the following formula (1A):

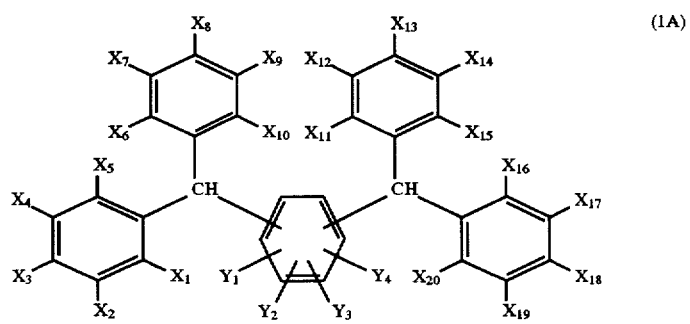

(1A)

wherein $X_1$ to $X_{20}$ and $Y_1$ to $Y_4$ are the same or different from one another and selected from the group consisting of a hydrogen atom, an alkyl group, an alkoxyl group and a group represented by -OD (in which D is a hydrogen atom or an organic group containing a 1,2-quinonediazide moiety), provided that at least one of $X_1$ to $X_5$, at least one of $X_6$ to $X_{10}$, at least one of $X_{11}$ to $X_{15}$, at least one of $X_{16}$ to $X_{20}$ and at least one of $Y_1$ to $Y_4$ are a group represented by -OD, and at least one of the D's in the groups represented by -OD is an organic group containing a 1,2-quinonediazide moiety.

The first radiation sensitive resin composition is suitable to provide a positive resist having excellent focus latitude in particular.

According to the present invention, the above objects and advantages can be attained, secondly, by a radiation sensitive resin composition (to be referred to as "second radiation sensitive resin composition" or "second composition" hereinafter) which comprises an alkali soluble resin, a 1,2-quinonediazide compound and a phenol compound represented by the following formula (1B):

(1B)

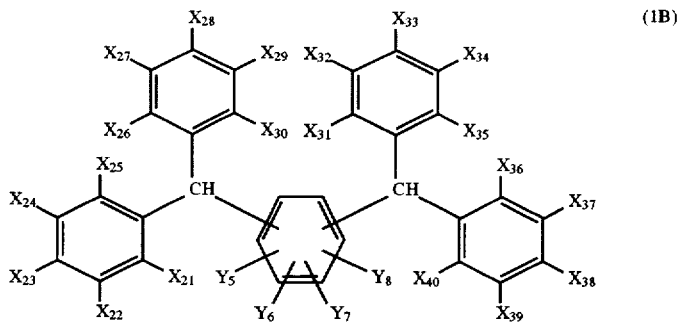

wherein $X_{21}$ to $X_{40}$ and $Y_5$ to $Y_8$ are the same or different from one another and are selected from the group consisting of a hydrogen atom, an alkyl group, an alkoxyl group and a hydroxyl group, provided that at least one of $X_{21}$ to $X_{25}$, at least one of $X_{26}$ to $X_{30}$, at least one of $X_{31}$ to $X_{35}$, at least one of $X_{36}$ to $X_{40}$ and at least one of $Y_5$ to $Y_8$ are a hydroxyl group.

The second radiation sensitive resin composition is suitable to provide a positive resist having excellent heat resistance in particular.

The present invention will be described in detail hereinunder, and the object, constitution and effect of the present invention will be apparent from the following description.

A description is first given of the first radiation sensitive resin composition.

Alkali Soluble Resin

Illustrative examples of the alkali soluble resin (to be referred to as "resin (A)" hereinafter) used in the present invention include novolak resins, polyvinyl phenols and derivatives thereof, styrene-maleic anhydride copolymers and derivatives thereof, polyvinyl hydroxy benzoates, carboxyl group-containing methacrylic acid resins and the like.

As the resin (A), they may be used alone or in combination of two or more.

Novolak resins are preferred as the resin (A). The novolak resins can be obtained by polycondensing a phenol represented by the following formula (2):

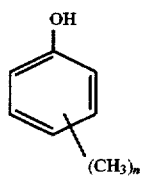

(2)

wherein n is an integer of 1 to 3, and an aldehyde such as a monoaldehyde compound or a dialdehyde compound.

Illustrative examples of the phenol include o-cresol, m-cresol, p-cresol, 2,3-xylenol, 2,5-xylenol, 3,4-xylenol, 3,5-xylenol, 2,3,5-trimethylphenol, 3,4,5-trimethylphenol and the like. Particularly preferred are o-cresol, m-cresol, p-cresol, 2,3-xylenol, 2,5-xylenol, 3,4-xylenol, 3,5-xylenol and 2,3,5-trimethylphenol. These phenols may be used alone or in combination of two or more. In this case, a combination of m-cresol, 2,3-xylenol and 3,4-xylenol (in a weight ratio of 20–95/5–80/0–75) or a combination of m-cresol, 2,3,5-trimethylphenol and 2,3-xylenol (in a weight ratio of 20–95/5–80/0–75) is particularly preferred.

Illustrative examples of the monoaldehyde to be polycondensed with the above phenol include formaldehyde, trioxane, paraformaldehyde, benzaldehyde, acetoaldehyde, propylaldehyde, phenylacetoaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural and the like. Illustrative examples of the dialdehyde include glyoxal, glutaraldehyde, terephthalaldehyde, isophthalaldehyde and the like. Among these, formaldehyde is particularly preferred.

Illustrative examples of the source of formaldehyde include formalin, trioxane, paraformaldehyde, methylhemiformal, ethylhemiformal, propylhemiformal, butylhemiformal, phenylhemiformal and the like. Among these, formalin and butylhemiformal are particularly preferred.

These aldehydes may be used alone or in combination of two or more. The amount of the aldehyde used is preferably 0.7 to 3 moles, more preferably 0.8 to 1.5 moles, based on 1 mole of the phenol.

An acid catalyst is generally used for a polycondensation reaction between the phenol and the aldehyde. Illustrative examples of the acid catalyst include hydrochloric acid, nitric acid, sulfuric acid, formic acid, oxalic acid, acetic acid and the like. The amount of the acid catalyst used is usually $1 \times 10^{-5}$ to $5 \times 10^{-1}$ moles based on 1 mole of the phenol.

In the polycondensation reaction, water is used as a reaction medium. However, when the phenol used in the polycondensation reaction is not dissolved in an aqueous solution of the aldehyde and a heterogeneous system is produced at the beginning of the reaction, a hydrophilic solvent may be used as the reaction medium. Examples of the hydrophilic solvent include alcohols such as methanol, ethanol, propanol and butanol; cyclic ethers such as tetrahydrofuran and dioxane; and the like. The amount of the reaction medium used is usually 23 to 1,000 parts by weight based on 100 parts by weight of reaction materials.

The temperature of the polycondensation reaction may be suitably adjusted according to the reactivity of the reaction materials, but is usually 10° to 200° C.

Examples of the polycondensation reaction method include a method in which a phenol, an aldehyde, an acid catalyst and the like are charged at the same time and a method in which a phenol, an aldehyde and the like are added in the presence of an acid catalyst as the reaction proceeds.

After completion of the polycondensation reaction, to remove unreacted starting materials, acid catalyst, reaction medium and the like present in the system, the temperature of the reaction system is generally elevated to 130° to 230° C. and a volatile substance is removed under reduced pressure, whereby a novolak resin is collected.

The weight average molecular weight (to be referred to as "Mw" hereinafter) of the novolak resin used in the present invention in terms of polystyrene is preferably 2,000 to 20,000, particularly preferably 3,000 to 15,000, from a view point of workability on application of the composition of the present invention to the substrate, as well as developability, sensitivity and heat resistance of the composition.

To obtain a novolak resin having a high Mw, a novolak resin obtained by the above method is dissolved in a good solvent such as ethylene glycol monomethyl ether acetate, dioxane, methanol, ethyl acetate or the like and then, mixed with a poor solvent such as water, n-hexane, n-heptane or the like. Thereafter, the deposited resin solution layer is separated to collect a high molecular weight novolak resin.

Dissolution Promoter

In the first radiation sensitive resin composition, a low molecular weight phenol compound may be added as a dissolution promoter for the purpose of promoting the alkali solubility of the resin (A). This low molecular weight phenol compound is preferably a phenol compound having 2 to 5 benzene rings such as a compound represented by the following formulas (3-1) to (3-9).

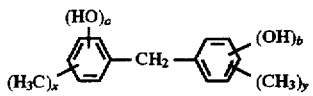  (3-1)

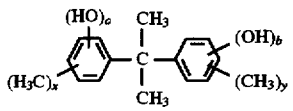  (3-2)

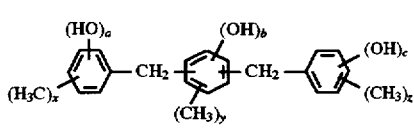  (3-3)

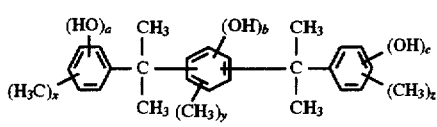  (3-4)

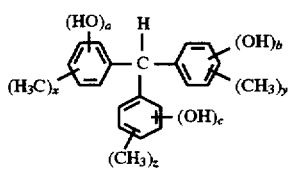  (3-5)

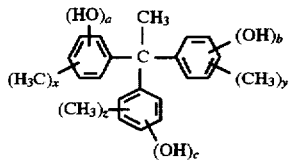  (3-6)

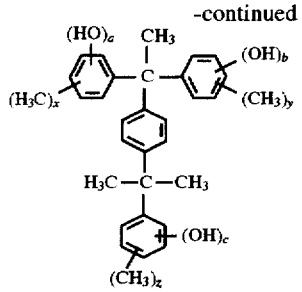  (3-7)

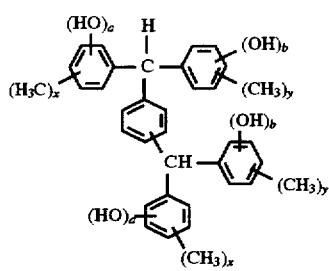  (3-8)

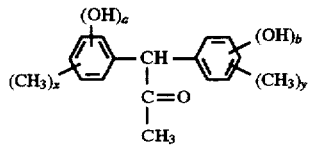  (3-9)

In the above formulas (3-1) to (3-9), a, b and c are each a numeral of 0 to 3 (except that all are 0), and x, y and z are each a numeral of 0 to 3, a+x<5 and b+y<5 (as for the formulas (3-3) and (3-4), b+y<4 and c+z<5).

The amount of the low molecular weight phenol compound used is usually 50 parts or less by weight based on 100 parts by weight of the resin (A).

Other Alkali Soluble Resins

In the first radiation sensitive resin composition, part of the resin (A) may be substituted by a low molecular weight alkali soluble novolak resin or alkali soluble resol resin (to be referred to as "resin (B)" hereinafter) for the purpose of promoting the alkali solubility of the resin (A).

The resin (B) can be obtained by a polycondensation reaction between a phenol and an aldehyde. In addition to phenols used in the synthesis of the novolak resin, phenol, 1-naphthol, 2-naphthol and the like may be used as the phenol. The above-described aldehyde used in the synthesis of the novolak resin may be used as the aldehyde. In this case, the amount of the aldehyde used is usually 0.2 to 0.8 mole based on 1 mole of the phenol. In the polycondensation reaction, an alkaline catalyst may be used in the production of a resol resin in addition to the acid catalyst used in the production of the novolak resin.

The Mw of the resin (B) is preferably 200 to less than 2,000, particularly preferably 300 to 1,000. Illustrative examples of the resin (B) include phenol/formaldehyde condensation resins, m-cresol/formaldehyde condensation resins, p-cresol/formaldehyde condensation resins, o-cresol/formaldehyde condensation resins, and the like. The amount of the resin (B) used is usually 50 parts or less by weight based on 100 parts by weight of the resin (A).

1,2-guinonediazide Compound

The first composition of the present invention contains a compound represented by the above formula (1A) as the 1,2-quinonediazide compound.

In the formula (1A), $X_1$ to $X_{20}$ and $Y_1$ to $Y_4$ are the same or different from one another and selected from the group consisting of a hydrogen atom, an alkyl group, an alkoxyl group and a group represented by -OD (in which D is a hydrogen atom or an organic group containing a 1,2-quinonediazide moiety), provided that at least one of $X_1$ to $X_5$, at least one of $X_6$ to $X_{10}$, at least one of $X_{11}$ to $X_{15}$ and at least one of $X_{16}$ to $X_{20}$ are a group represented by -OD.

Here, the alkyl group is preferably an alkyl group having 1 to 4 carbon atoms, such as methyl, ethyl, n-propyl, isopropyl, n-butyl, t-butyl or the like. The alkoxyl group is preferably an alkoxyl group having 1 to 4 carbon atoms, such as methoxy, ethoxy, propoxy, butoxy or the like.

In the formula (1A), $Y_1$ to $Y_4$ are the same or different from one another and selected from the group consisting of a hydrogen atom, an alkyl group, an alkoxyl group and a group represented by -OD (in which D is a hydrogen atom or an organic group containing a 1,2-quinonediazide moiety), and at least one of $Y_1$ to $Y_4$ is a group represented by -OD.

Examples of the alkyl group and the alkoxyl group are the same as those specified for $X_1$ to $X_{20}$. The group represented by -OD is defined as the same for $X_1$ to $X_{20}$.

The organic group containing a 1,2-quinonediazide moiety in D is a 1,2-quinonediazidesulfonyl group such as 1,2-benzoquinonediazide-4-sulfonyl group, 1,2-naphthoquinonediazide-4-sulfonyl group, 1,2-naphthoquinonediazide-5-sulfonyl group and 1,2-naphthoquinonediazide-6-sulfonyl group. Particularly preferred are 1,2-naphthoquinonediazide-4-sulfonyl group and 1,2-naphthoquinonediazide-5-sulfonyl group.

In the formula (1A), a compound in which all D's are a hydrogen atom, that is, a compound in which the group represented by -OD is a hydroxyl group, is a precursor of a compound represented by the formula (1A) (this precursor will be referred to as "compound (a)" hereinafter).

The compound (a) can be synthesized by, for example, reacting a compound represented by the following formula and a phenol in the presence of an acid such as hydrochloric acid, sulfuric acid, p-toluene sulfonic acid or the like.

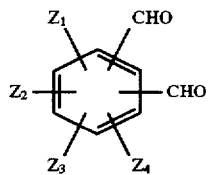

wherein $Z_1$ to $Z_4$ are the same or different from one another and are selected from the group consisting of a hydrogen atom, an alkyl group, an alkoxyl group and a hydroxyl group, and at least one of $Z_1$ to $Z_4$ is a hydroxyl group.

Illustrative examples of the compound (a) include compounds represented by the following formulas (4-1) to (4-24).

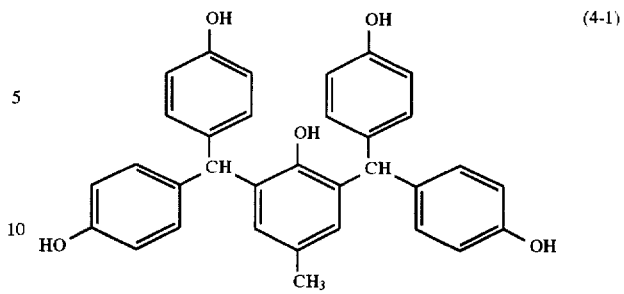
(4-1)

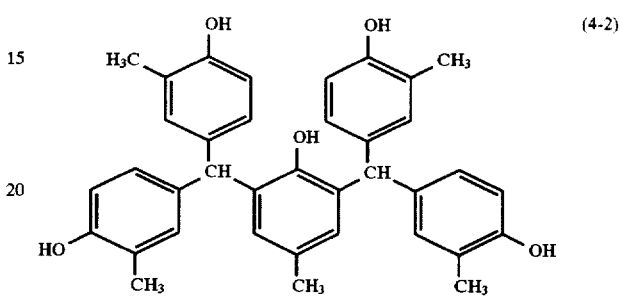
(4-2)

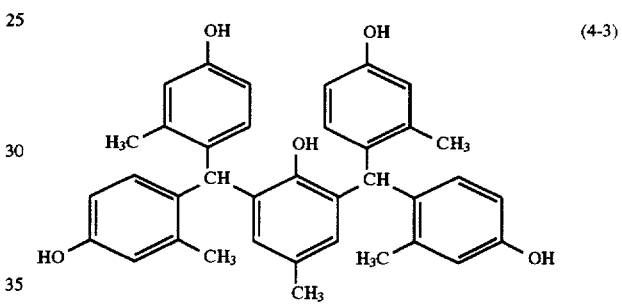
(4-3)

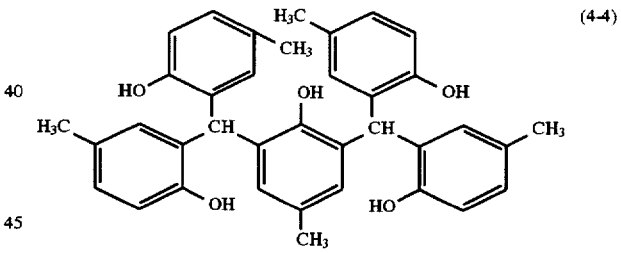
(4-4)

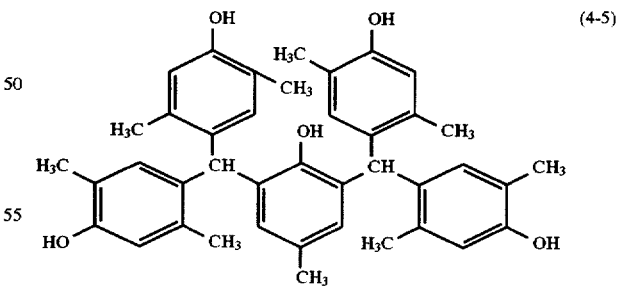
(4-5)

-continued
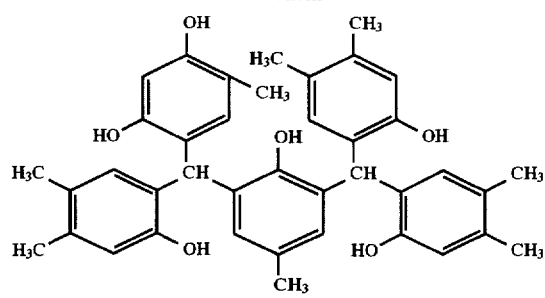 (4-6)
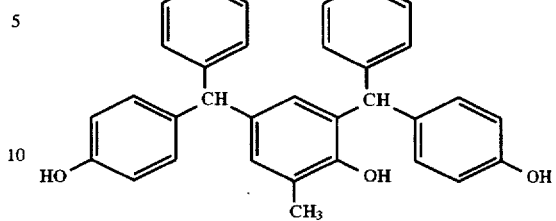 (4-11)
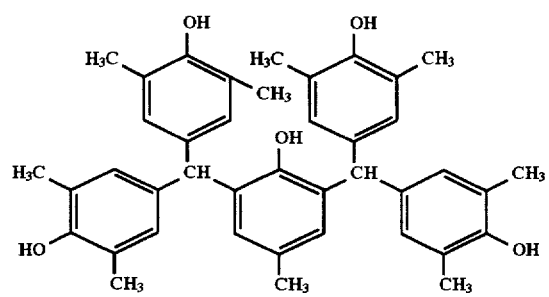 (4-7)
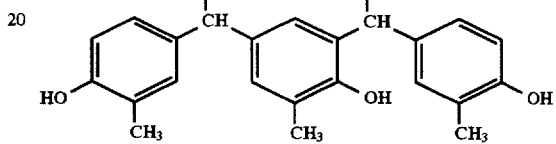 (4-12)
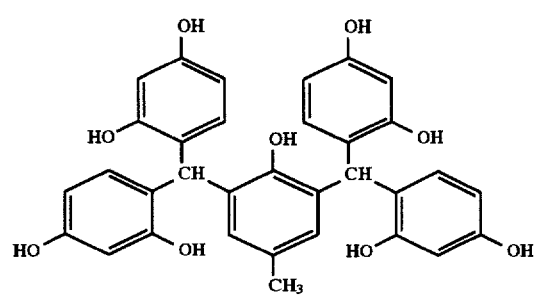 (4-8)
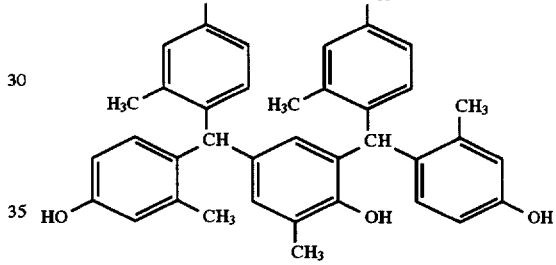 (4-13)
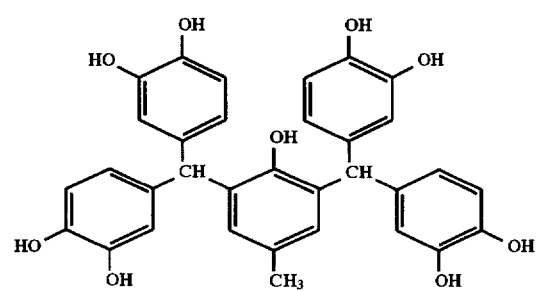 (4-9)
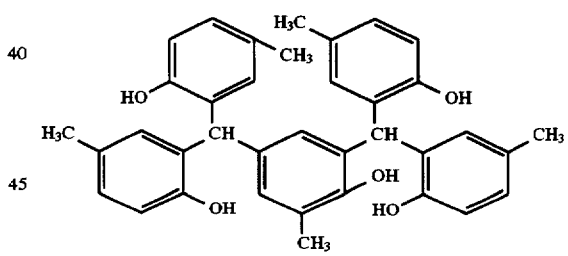 (4-14)
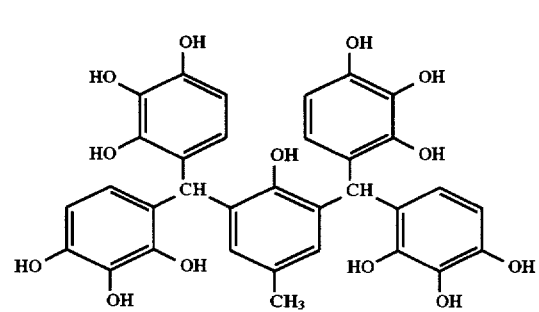 (4-10)
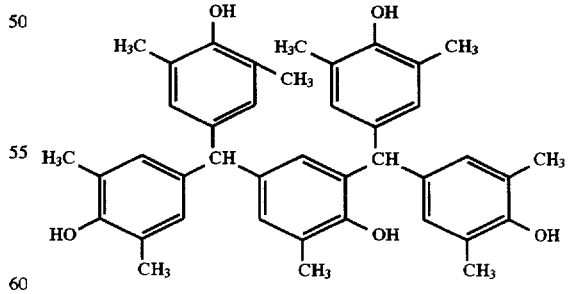 (4-15)

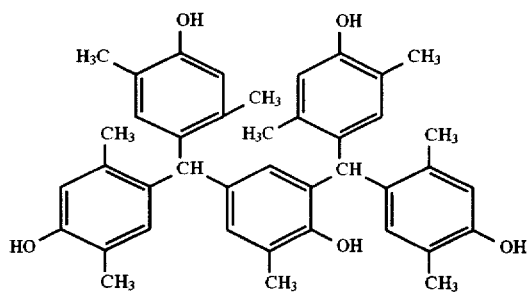
(4-16)

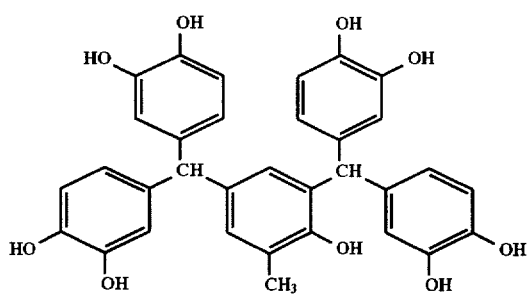
(4-17)

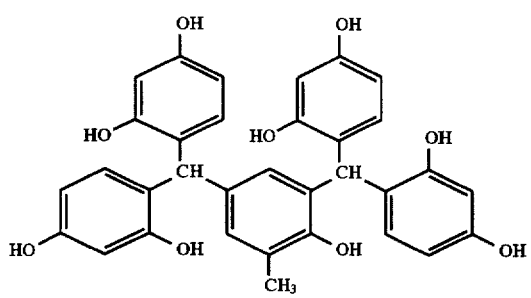
(4-18)

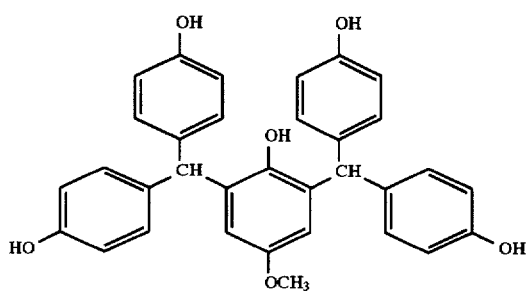
(4-19)

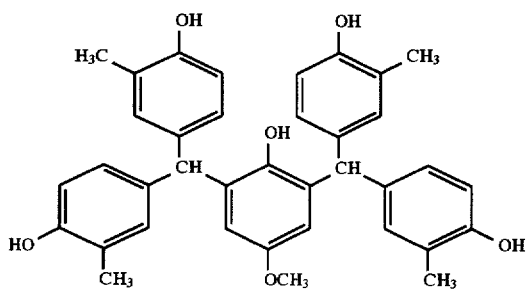
(4-20)

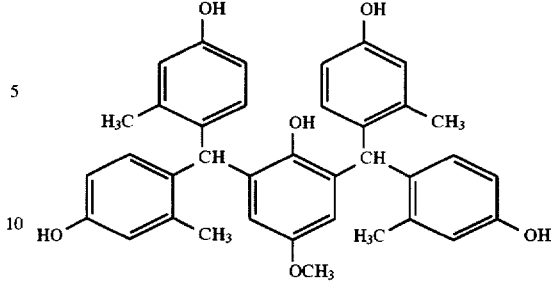
(4-21)

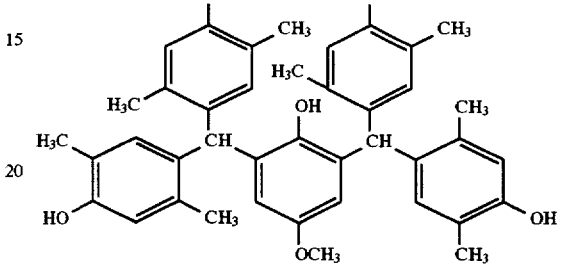
(4-22)

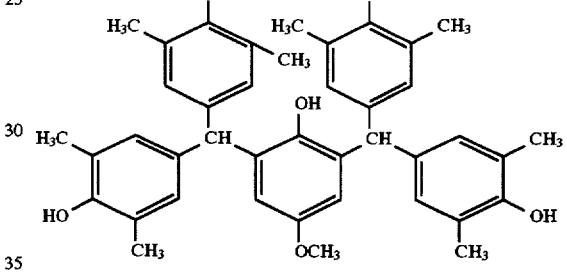
(4-23)

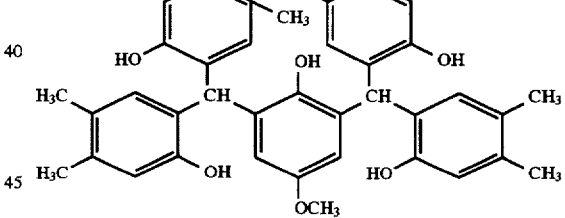
(4-24)

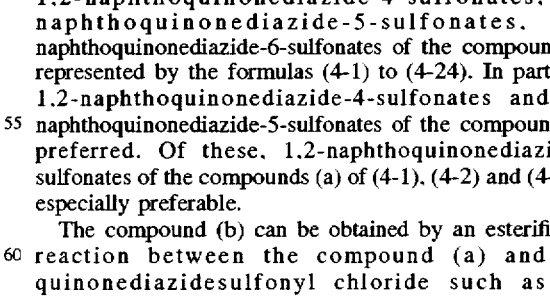

Illustrative examples of the compound represented by the formula (1A) (to be referred to as "compound (b)" hereinafter) include 1,2-benzoquinonediazide-4-sulfonates, 1,2-naphthoquinonediazide-4-sulfonates, 1,2-naphthoquinonediazide-5-sulfonates, 1,2-naphthoquinonediazide-6-sulfonates of the compounds (a) represented by the formulas (4-1) to (4-24). In particular, 1,2-naphthoquinonediazide-4-sulfonates and 1,2-naphthoquinonediazide-5-sulfonates of the compounds are preferred. Of these, 1,2-naphthoquinonediazide-5-sulfonates of the compounds (a) of (4-1), (4-2) and (4-5) are especially preferable.

The compound (b) can be obtained by an esterification reaction between the compound (a) and 1,2-quinonediazidesulfonyl chloride such as 1,2-naphthoquinonediazide-4-sulfonyl chloride, 1,2-naphthoquinonediazide-5-sulfonyl chloride or the like. The reaction ratio of the compound (a) and the 1,2-naphthoquinonediazidesulfonyl chloride in the esterification reaction is preferably 0.25 to 1 equivalent, more preferably 0.4 to 1 equivalent, of 1,2-naphthoquinonediazidesulfonyl chloride based on 1 equivalent of a phenolic hydroxyl group of the compound (a). These compounds are reacted with each other under the presence of 0.3 to 1.3 equivalent of a basic catalyst such as triethylamine or pyridine to produce the desired compound (b).

In the first composition of the present invention, the compound (b) is used in an amount of 5 to 50 parts by weight, preferably 10 to 40 parts by weight, based on 100 parts by weight of the resin (A). The compound (b) may be used alone or in combination of two or more.

In the first composition of the present invention, a 1,2-quinonediazide compound such as a 1,2-benzoquinonediazide-4-sulfonate, 1,2-naphthoquinonediazide-4-sulfonate, 1,2-naphthoquinonediazide-5-sulfonate or the like may be contained in addition to the compound (b). The 1,2-quinonediazide compound is a 1,2-quinonediazide sulfonate such as 2,3,4-trihydroxybenzophenone, 2,3,4,4'-tetrahydroxybenzophenone, 2,3,4,2',4'-pentahydroxybenzophenone, tris(4-hydroxyphenyl)methane, 1,3,5-tris(4-hydroxy-α,α-dimethylbenzyl)benzene, 1,1-bis(4-hydroxyphenyl)-1-[4-{1-(4-hydroxyphenyl)-1-methylethyl}phenyl]ethane, 2-(3,4-dihydroxyphenyl)-2-(4-hydroxyphenyl)propane, 1-phenyl-1,3,3-tris(2,5-dimethyl-4-hydroxyphenyl)propane, 4,6-bis{1-(4-hydroxyphenyl)-1-methylethyl}-1,3-dihydroxybenzene, 2,4,4-trimethyl-2-(2,4-dihydroxyphenyl)-7-hydroxychroman and the like.

In the first composition of the present invention, the amount of the 1,2-quinonediazide compound other than the compound (b) is preferably 100 parts or less by weight based on 100 parts by weight of the resin (A).

The total amount of the 1,2-quinonediazide sulfonyl residue contained in the first composition of the present invention is preferably adjusted to 5 to 50% by weight, more preferably to 10 to 30% by weight, based on the total solid content of the composition.

A description is subsequently given of the second radiation sensitive resin composition of the present invention.

Alkali Soluble Resin

The alkali soluble resin used in the first radiation sensitive resin composition is also used in the second radiation sensitive resin composition. Therefore, it should be understood that a description of the above-mentioned alkali soluble resin used in the first radiation sensitive resin composition should be applied to the second radiation sensitive resin composition.

Phenol Compound

The second composition of the present invention contains a phenol compound represented by the above formula (1B).

In the formula (1B), $X_{21}$ to $X_{40}$ and $Y_5$ to $Y_8$ are the same or different from one another and selected from the group consisting of a hydrogen atom, an alkyl group, an alkoxyl group and a hydroxyl group, provided that at least one of $X_{21}$ to $X_{25}$, at least one of $X_{26}$ to $X_{30}$, at least one of $X_{31}$ to $X_{35}$, at least one of $X_{36}$ to $X_{40}$ and at least one of $Y_5$ to $Y_8$ are a hydroxyl group.

The alkyl group is preferably an alkyl group having 1 to 4 carbon atoms, such as methyl, ethyl, n-propyl, isopropyl, n-butyl, t-butyl or the like. The alkoxyl group is preferably an alkoxyl group having 1 to 4 carbon atoms, such as methoxy, ethoxy, propoxy, butoxy or the like.

The phenol compound represented by the above formula (1B) is a precursor of the compound of the above formula (1A) used in the first composition, that is, the compound (a).

Therefore, specific examples of the phenol compound represented by the formula (1B) are the same as the compounds represented by the above formulas (4-1) to (4-24).

In the second composition of the present invention, the compound (a) is used in an amount of 5 to 50 parts by weight, particularly preferably 10 to 40 parts by weight, based on 100 parts by weight of the resin (A). The compound (a) may be used alone or in combination with two or more.

In the second composition of the present invention, a phenol compound other than the compound (a) may be contained in combination with the compound (a). The phenol compound other than the compound (a) is selected from phenol compounds having 2 to 5 benzene rings, low molecular weight alkali soluble novolak resins having an Mw of 300 to 1,000 and the like. The amount of such phenol compound or the alkali soluble novolak resin used is usually 50 parts or less by weight based on 100 parts by weight of the resin (A).

Illustrative examples of the phenol compound can be selected from the compounds represented by the above formulas (3-1) to (3-8) specified as examples of the dissolution promoter.

1,2-quinonediazide Compound

The 1,2-quinonediazide compound used in the second composition of the present invention is a 1,2-quinonediazide compound such as a 1,2-benzoquinonediazide-4-sulfonate, 1,2-naphthoquinonediazide-4-sulfonate, 1,2-naphthoquinonediazide-5-sulfonate or the like. The 1,2-quinonediazide compound can be obtained by a conventional method, i.e., for example, by condensing a naphthoquinonediazide sulfonyl halide and a phenol compound in the presence of a weak base. Illustrative examples of the phenol compound include the above compound (a), 2,3,4-trihydroxybenzophenone, 2,3,4,4'-tetrahydroxybenzophenone, 2,3,4,2',4'-pentahydroxybenzophenone, tris(4-hydroxyphenyl)methane, 1,3,5-tris(4-hydroxy-α,α-dimethylbenzyl)benzene, 1,1,-bis(4-hydroxyphenyl)-1-[4-{1-(4-hydroxyphenyl)-1-methylethyl}phenyl]ethane, 2-(3,4-dihydroxyphenyl)-2-(4-hydroxyphenyl)propane, 1-phenyl-1,3,3-tris(2,5-dimethyl-4-hydroxyphenyl)propane, 4,6-bis{1-(4-hydroxyphenyl)-1-methylethyl}-1,3-dihydroxybenzene, 2,4,4-trimethyl-2-(2,4-dihydroxyphenyl)-7-hydroxychroman and the like.

The amount of the 1,2-quinonediazide compound used is preferably 100 parts or less by weight based on 100 parts by weight of the resin (A).

The total amount of the 1,2-quinonediazide sulfonyl residue contained in the second composition of the present invention is preferably adjusted to 5 to 50% by weight, more preferably to 10 to 30% by weight, based on the total solid content of the composition.

A description is subsequently given of various kinds of compounding agents and solvents used both in the first composition and the second composition as well as the formation of a resist film.

Various Kinds of Compounding Agents

Various kinds of compounding agents such as a sensitizer, surfactant or the like can be added to the composition of the present invention as needed.

The sensitizer is used to improve the sensitivity of a resist, with illustrative examples thereof including 2H-pyrido-[3, 2-b]-1,4-oxazine-3(4H)-onnes, 10H-pyrido-[3,2-b]-(1,4')-benzothiazines, urazols, hydantoins, barbituric acids, glycine anhydrides, 1-hydroxybenzotriazoles, alloxans, maleimides and the like. The amount of the sensitizer used is preferably 50 parts or less by weight based on 100 parts by weight of the resin (A).

The surfactant is used to improve the applicability and developability of the resin, with illustrative examples thereof including polyoxyethylene lauryl ether, polyoxyethylene oleyl ether, polyoxyethylene octylphenyl ether, polyoxyethylene nonylphenyl ether, polyethylene glycol dilaurate, polyethylene glycol distearate, Megafuck F171, F172 and F173 (trade name, manufactured by Dainippon Ink and Chemicals, Inc.), Florade FC430 and FC431 (trade name, manufactured by Sumitomo 3M Co.), Asahi Guard AG710, Surflon S-382 SC-101, SC-102, SC-103, SC-104, SC-105 and SC-106 (trade name, manufactured by Asahi Glass Co., Ltd), KP341 (trade name, manufactured by Shin-Etsu Chemical Co., Ltd), Polyflow No.75 and No.95 (trade name, manufactured by Kyoeisha Yushi Kagaku Kogyo Co., Ltd) and the like.

The amount of the effective component of the surfactant used is preferably 2 parts or less by weight based on 100 parts by weight of the solid content of the composition excluding compounding agents.

Further, the composition of the present invention may contain a dye and a pigment to make visible a latent image formed on radiation exposed portions of a resist and reduce the effect of halation during exposure to radiation and may contain also an adhesive auxiliary to improve bonding strength. Moreover, a storage stabilizer, anti-foamer and the like may be added as needed.

Solvent

The composition of the present invention is prepared by dissolving a solid content such as the above resin (A) and the like in a solvent such that a solid content concentration is 20 to 40% by weight, and filtrating the solution with a filter having a pore diameter of about 0.2 μm.

Illustrative examples of the solvent include ethylene glycol monomethylether, ethylene glycol monoethyether, ethylene glycol monomethylether acetate, ethylene glycol monoethylether acetate, diethyleneglycol monomethylether, diethyleneglycol monoethylether, propyleneglycol methylether acetate, propyleneglycol propylether acetate, toluene, xylene, methylethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-ethoxypropionate, ethyl 3-methoxypropionate, methyl 3-methoxy-2-methylpropionate, ethyl acetate, butyl acetate and the like. Further, a high-boiling solvent such as N-methyl formamide, N,N-dimethyl formamide, N-methyl formanilide, N-methyl acetoamide, N,N-dimethyl acetoamide, N-methyl pyrrolidone, dimethyl sulfoxide, benzylethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate or the like may be added. These solvents may be used alone or in combination of two or more.

Formation of Resist Film

The composition of the present invention prepared in the form of a solution is applied to a silicon wafer or a wafer coated with aluminum or the like by a rotary coating, a casting coating, a roll coating or the like. Thereafter, the wafer is prebaked to form a resist film which in turn is exposed to radiation to form a desired resist pattern. The film is then developed with a developer to form a pattern.

The radiation used in the formation of a resist pattern is preferably an ultraviolet ray such as g-line and i-line, but a far ultraviolet ray such as an excimer laser beam, X-ray such as synchrotron radiation, and a charged particle beam such as an electron beam may also be used.

After a resist film is formed from the composition of the invention and the film is prebaked and exposed to radiation, the film is post-baked at 70° to 140° C., followed by development, whereby the effect of the present invention can be further improved.

As the developer used for the resist film, there are used an alkaline aqueous solution prepared by dissolving an alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-[5.4.0]-7-undecene, 1,5-diazabicyclo-[4.3.0]-5-nonene or the like in water such that it has a concentration of 1 to 10% by weight, for example.

To the developer may be added aqueous organic solvents including an alcohol such as methanol or ethanol or a surfactant in a suitable amount.

When a developer composed of such an alkaline solution is used, the resist film is generally washed in water after development.

The present invention will be described in detail with reference to the following examples; however, these examples are intended to illustrate the invention and are not to be construed to limit the scope of the invention. The measurement of Mw and the evaluation of resist films of the examples were conducted in accordance with the following methods.

[Mw]:

Using GPC columns manufactured by Toso Co. (consisting of two of G2000H$_{XL}$, one of G3000H$_{XL}$ and one of 4000H$_{XL}$), Mw was measured by gel permeation chromatography which was based on mono-disperse polystyrene as a standard, under the following analytical conditions: flow rate: 1.0 ml/minute, eluation solvent: tetrahydrofuran, column temperature: 40° C.

[Resolution]:

The minimum dimension of a line-and-space pattern separated with an amount of exposure with which a 0.4 μm line-and-space pattern is resolved into 1:1 without a reduction in the thickness of the film was measured with a scanning electron microscope.

[Developability]:

A resist film was formed from the composition and degrees of scum and developer residue after the formation of a pattern were checked with a scanning electron microscope.

[Heat resistance]:

A wafer having a pattern formed thereon was heated in an oven for 2 minutes and a temperature at which a 2.0 μm line-and-space pattern began to deform with heat was measured.

[Focus range (focus latitude)]:

Using a scanning electron microscope, a focus deviation width when the dimension of a resolved pattern in a 0.4 μm line-and-space pattern falls within ±10% of the design dimension of a mask is taken as a focus range which is used as an evaluation index. A large focus range means that focus latitude is good.

[Synthesis of resin (A)]

<Synthesis Example 1>

69.2 g (0.64 mole) of m-cresol, 9.8 g (0.08 mole) of 2,3-xylenol, 9.8 g (0.08 mole) of 3,4-xylenol, 61.0 g (0.75 mole of formaldehyde) of an aqueous solution containing 37% by weight of formaldehyde, 6.3 g (0.05 mole) of oxalic acid dihydrate, 52.6 g of water and 182 g of dioxane were charged into an autoclave which was then immersed in an oil bath. While a temperature inside the autoclave was maintained at 130° C., these materials were condensed for 8 hours under stirring. After reaction, the temperature was lowered to room temperature and the contents were taken out into a beaker. The reaction product was separated into two layers in the beaker, and then a lower layer was taken out from the beaker, concentrated, dehydrated and dried to collect a novolak resin. This resin was taken as resin (A1). The resin (A1) had an Mw of 8,600.

<Synthesis Example 2>

64.9 g (0.6 mole) of m-cresol, 36.7 g (0.3 mole) of 2,3-xylenol, 12.2 g (0.1 mole) of 3,4-xylenol, 77.1 g (0.9 mole of formaldehyde) of an aqueous solution containing 37% by weight of formaldehyde, 6.3 g (0.05 mole) of oxalic dihydrate, 79.4 g of water and 383.9 g of dioxane were charged into an autoclave which was then immersed in an oil bath. While a temperature inside the autoclave was maintained at 130° C., these materials were condensed for 8 hours under stirring. After reaction, the temperature was lowered to room temperature and the contents were taken out into a beaker. The reaction product was separated into two layers in the beaker, and then a lower layer was taken out from the beaker, concentrated, dehydrated and dried to collect a novolak resin. This resin was taken as resin (A2). The resin (A2) had an Mw of 7,800.

[Synthesis of 1,2-quinonediazide compound (compound (b)) represented by formula (1A)]

A compound represented by the above formula (4-1), a compound represented by the above formula (4-2), a compound represented by the above formula (4-5) and a compound represented by the above formula (4-7) are referred to as compound (a-1), compound (a-2), compound (a-5) and compound (a-7), respectively, hereinafter.

<Synthesis Example 3>

25.2 g (0.05 mole) of the compound (a-1), 40.3 g (0.15 mole) of 1,2-naphthoquinonediazide-5-sulfonyl chloride, 269 g of dioxane and 67 g of N,N-dimethyl formamide were charged into a flask equipped with a stirrer, a dropping funnel and a thermometer while light was shielded, and dissolved under stirring.

Thereafter, the flask was immersed in a water bath maintained to a temperature of 30° C. and when the temperature inside the flask became constant at 30° C., 18.2 g (0.18 mole) of triethylamine was dropped slowly to this solution using a dropping funnel with care so that the inside temperature did not exceed 35° C.

Deposited triethylamine hydrochloride was then removed by filtration and the filtrate was poured into a large amount of diluted hydrochloric acid to separate out a precipitate. The precipitate was collected by filtration and dried for 24 hours in a heat vacuum drier maintained to a temperature of 40° C. to obtain a compound (b-1).

As the result of analysis in accordance with $^1$H-NMR, the compound (b-1) is a compound in which 60 mol %, on average, of a hydroxyl group in the compound (a-1) was substituted by 1,2-naphthoquinonediazide-5-sulfonate.

<Synthesis Example 4>

The procedure of Synthesis Example 3 was repeated except that 29.5 g (0.05 mole) of the compound (a-5), 40.3 g (0.15 mole) of 1,2-naphthoquinonediazide-5-sulfonyl chloride, 18.2 g (0.18 mole) of triethylamine, 282 g of dioxane and 70 g of N,N-dimethyl formamide were used to obtain a compound (b-2).

As the result of analysis in accordance with $^1$H-NMR, the compound (b-2) is a compound in which 60 mol %, on average, of a hydroxyl group in the compound (a-5) was substituted by 1,2-naphthoquinonediazide-5-sulfonate.

<Synthesis Example 5>

The procedure of Synthesis Example 3 was repeated except that 29.5 g (0.05 mole) of the compound (a-7), 40.3 g (0.15 mole) of 1,2-naphthoquinonediazide-5-sulfonyl chloride, 18.2 g (0.18 mole) of triethylamine, 282 g of dioxane and 70 g of N,N-dimethyl formamide were used to obtain a compound (b-3).

As the result of analysis in accordance with $^1$H-NMR, the compound (b-3) is a compound in which 60 mol %, on average, of a hydroxyl group in the compound (a-7) was substituted by 1,2-naphthoquinonediazide-5-sulfonate.

<Synthesis Example 6>

The procedure of Synthesis Example 3 was repeated except that 29.5 g (0.05 mole) of the compound (a-5), 47.0 g (0.175 mole) of 1,2-naphthoquinonediazide-5-sulfonyl chloride, 19.4 g (0.193 mole) of triethylamine, 307 g of dioxane and 77 g of N,N-dimethyl formamide were used to obtain a compound (b-4).

As the result of analysis in accordance with $^1$H-NMR, the compound (b-4) is a compound in which 70 mol %, on average, of a hydroxyl group in the compound (a-5) was substituted by 1,2-naphthoquinonediazide-5-sulfonate.

<Synthesis Example 7>

The procedure of Synthesis Example 3 was repeated except that 28.0 g (0.05 mole) of the compound (a-2), 40.3 g (0.15 mole) of 1,2-naphthoquinonediazide-5-sulfonyl chloride, 18.2 g (0.18 mole) of triethylamine and 346 g of dioxane were used and N,N-dimethyl formamide was not used to obtain a compound (b-5).

As the result of analysis in accordance with $^1$H-NMR, the compound (b-5) is a compound in which 60 mol %, on average, of a hydroxyl group in the compound (a-2) was substituted by 1,2-naphthoquinonediazide-5-sulfonate.

[Synthesis of other 1,2-quinonediazide compounds]

<Synthesis Example 8>

The procedure of Synthesis Example 3 was repeated except that 24.6 g (0.10 mole) of 2,3,4,4'-tetrahydroxybenzophenone, 80.6 g (0.30 mole) of 1,2-naphthoquinonediazide-5-sulfonyl chloride, 33.3 g (0.33 mole) of triethylamine and 552 g of dioxane were used to obtain a 1,2-quinonediazide compound (i).

As the result of analysis in accordance with $^1$H-NMR, the 1,2-quinonediazide compound (i) is a compound in which 75 mol %, on average, of a hydroxyl group in the 2,3,4,4'-tetrahydroxybenzophenone was substituted by 1,2-naphthoquinonediazide-5-sulfonate.

<Synthesis Example 9>

The procedure of Synthesis Example 3 was repeated except that 23.7 g (0.05 mole) of a compound represented by the following formula (5)

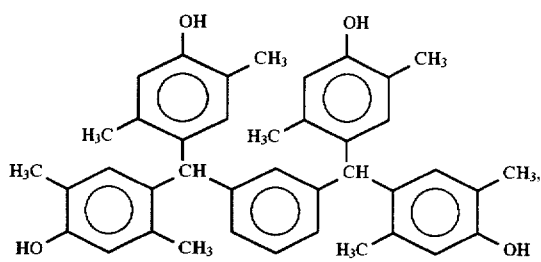

(5)

40.3 g (0.15 mole) of 1,2-naphthoquinonediazide-5-sulfonyl chloride, 18.2 g (0.18 mole) of triethylamine and 328 g of dioxane were used to obtain a 1,2-quinonediazide compound (ii).

As the result of analysis in accordance with $^1$H-NMR, the 1,2-quinonediazide compound (ii) is a compound in which 75 mol %, on average, of a hydroxyl group in the compound represented by the formula (5) was substituted by 1,2-naphthoquinonediazide-5-sulfonate.

<Synthesis Example 10>

14.6 g (0.05 mole) of tris(4-hydroxyphenyl)methane, 33.5 g (0.125 mole) of 1,2-naphthoquinonediazide-5-sulfonyl chloride and 248 g of dioxane were charged into a flask equipped with a stirrer, a dropping funnel and a thermometer while light was shielded, and dissolved under stirring.

Thereafter, the flask was immersed in a water bath maintained to a temperature of 30° C. and when a temperature inside the flask became constant at 30° C., 13.9 g (0.138 mole) of triethylamine was dropped slowly to this solution using a dropping funnel with care so that the inside temperature did not exceed 35° C.

Deposited triethylamine hydrochloride was then removed by filtration and the filtrate was poured into a large amount of diluted hydrochloric acid to separate a precipitate. The precipitate was collected by filtration and dried for 24 hours in a heat vacuum drier controlled to a temperature of 40° C. to obtain a 1,2-quinonediazide compound (iii).

<Synthesis Example 11>

The procedure of Synthesis Example 10 was repeated except that 21.2 g (0.05 mole) of 1,1-bis(4-hydroxyphenyl)-1-[4-{1-(4-hydroxyphenyl)-1-methylethyl}phenyl]ethane, 26.8 g (0.1 mole) of 1,2-naphthoquinonediazide-5-sulfonyl chloride, 11.1 g (0.11 mole) of triethylamine and 236 g of dioxane were used to obtain a 1,2-quinonediazide compound (iv).

EXAMPLES 1 TO 10 AND COMPARATIVE EXAMPLES 1 TO 4

The resin (A), a dissolution promoter, a 1,2-quinonediazide compound and a solvent were mixed in a ratio (parts stands for parts by weight) shown in Table 1 to prepare a homogeneous solution. The solution was filtrated with a membrane filter having a pore diameter of 0.2 μm to prepare a solution of a composition.

The thus obtained solution was applied to a silicon wafer having a silicon oxide film formed thereon by a spinner and prebaked on a hot plate at 90° C. for 2 minutes to form a 1 μm-thick resist film. Thereafter, the resist film was exposed to light having a wavelength of 365 nm (i line) irradiated from the NSR-1755i7A reduction projection exposer manufactured by Nikon Co. (numerical aperture of lens=0.50) through a reticule. The exposed resist film was developed with an aqueous solution containing 2.38% by weight of tetramethyl ammonium hydroxide, rinsed with ultra-pure water, dried and evaluated for the performance of its composition. Results are shown in Table 1.

TABLE 1

| | | Resin (A) | | Dissolution promoter | | 1,2-Quinonediazide compound | | | | Solvent | | Resist performance | | |
|---|---|---|---|---|---|---|---|---|---|---|---|---|---|---|
| | | | | | | Compound (b) | | Others | | | | Resolution | Focus range | Develop- |
| | | Kind | Parts | Kind | Parts | Kind | Parts | Kind | Parts | Kind | Parts | (μm) | (μm) | ability |
| Ex. | 1 | A1 | 80 | α | 20 | b-1 | 35 | — | — | S1 | 340 | 0.34 | 1.6 | good |
| | 2 | A1 | 80 | α | 20 | b-2 | 30 | — | — | S1/S2 | 240/100 | 0.34 | 1.6 | do |
| | 3 | A2 | 80 | β | 20 | b-1 | 30 | — | — | S1 | 340 | 0.34 | 1.6 | do |
| | 4 | A1 | 80 | β | 20 | b-3 | 30 | — | — | S1/S2 | 240/100 | 0.36 | 1.4 | do |
| | 5 | A2 | 75 | α | 25 | b-2 | 30 | — | — | S1/S2 | 240/100 | 0.34 | 1.6 | do |
| | 6 | A2 | 80 | α | 20 | b-3 | 25 | (ii) | 5 | S1 | 340 | 0.36 | 1.4 | do |
| | 7 | A1 | 75 | α | 25 | b-2 | 25 | (ii) | 5 | S1/S2 | 240/100 | 0.36 | 1.4 | do |
| | 8 | A1 | 80 | α | 20 | b-4 | 30 | — | — | S1/S2 | 240/100 | 0.34 | 1.6 | do |
| | 9 | A1 | 80 | α | 20 | b-5 | 30 | — | — | S1/S2 | 240/100 | 0.34 | 1.6 | do |
| | 10 | A1 | 80 | γ | 20 | b-1 | 30 | — | — | S1 | 340 | 0.34 | 1.6 | do |
| Comp. Ex. | 1 | A1 | 80 | α | 20 | — | — | (ii) | 35 | S1 | 340 | 0.38 | 1.2 | good |
| | 2 | A2 | 80 | α | 20 | — | — | (ii) | 30 | S1 | 340 | 0.38 | 1.2 | scums exist |
| | 3 | A2 | 75 | α | 25 | — | — | (i)/(ii) | 10/20 | S1/S2 | 240/100 | 0.40 | 1.0 | do |
| | 4 | A1 | 80 | β | 20 | — | — | (i)/(ii) | 5/25 | S1/S2 | 240/100 | 0.40 | 1.0 | do |

In Table 1, kinds of the dissolution promoter and the solvent are as follows.

dissolution promoter:

α: 1,1,1-tris(4-hydroxyphenyl)ethane

β: 1,1-bis(4-hydroxyphenyl)-1-phenylethane

γ: 1,1-bis(4-hydroxy-2,5-dimethylphenyl)acetone solvent:

S1: ethyl 2-hydroxypropionate

S2: ethyl 3-ethoxypropionate

As is evident from the above Examples 1 to 10, a resist having excellent developability, high resolution and significantly improved focus latitude can be obtained from the first radiation sensitive resin composition of the present invention. Therefore, the radiation sensitive resin composition of the present invention can be suitably used as a resist for producing highly integrated circuits.

EXAMPLES 11 TO 14 AND COMPARATIVE EXAMPLES 5 TO 8

The resin (A), a phenol compound (a) or compound (b), a 1,2-quinonediazide compound and a solvent were mixed in a ratio shown in Table 2 (parts stands for parts by weight) to prepare a homogeneous solution. The solution was filtrated with a membrane filter having a pore diameter of 0.2 μm to prepare a solution of a composition.

The thus obtained solution was applied to a silicon wafer having a silicon oxide film formed thereon by a spinner and prebaked on a hot plate at 90° C. for 2 minutes to form a 1 μm-thick resist film. Thereafter, the resist film was exposed to light having a wavelength of 365 nm (i line) irradiated from the NSR-1755i7A reduction projection exposer manufactured by Nikon Co. (numerical aperture of lens=0.50) through a reticule. The exposed resist film was developed with an aqueous solution containing 2.38% by weight of tetramethyl ammonium hydroxide, rinsed with ultra-pure water, dried and evaluated for the performance of its composition. Results are shown in Table 2.

TABLE 2

| | | Resin (A) | | Phenol compound | | | | 1,2-quinone-diazide compound | | Solvent | | Resist performance | | |
|---|---|---|---|---|---|---|---|---|---|---|---|---|---|---|
| | | | | Compound (a) | | Other than compound (a) | | | | | | Resolution | Heat resistance | Develop- |
| | | Kind | Parts | Kind | Parts | Kind | Parts | Kind | Parts | Kind | Parts | (μm) | (°C.) | ability |
| Ex. | 11 | A1 | 80 | a-1 | 20 | — | — | (iii) | 30 | S1 | 340 | 0.35 | 140 | good |
| | 12 | A2 | 80 | a-1 | 10 | α | 10 | (iv) | 25 | S1 | 340 | 0.36 | 135 | do |
| | 13 | A1 | 80 | a-2 | 20 | — | — | (iv)/(i) | 20/10 | S1/S2 | 240/100 | 0.36 | 145 | do |
| | 14 | A2 | 75 | a-3 | 25 | — | — | (iii) | 30 | S1/S2 | 240/100 | 0.34 | 140 | do |
| Comp. Ex. | 5 | A1 | 80 | — | — | α | 20 | (iii) | 30 | S1 | 340 | 0.38 | 130 | scums exist |
| | 6 | A1 | 80 | — | — | α | 20 | (iv)/(i) | 20/10 | S1/S2 | 240/100 | 0.40 | 135 | do |
| | 7 | A2 | 75 | — | — | β | 25 | (iii) | 30 | S1/S2 | 240/100 | 0.38 | 130 | do |
| | 8 | A1 | 80 | — | — | γ | 20 | (iii) | 30 | S1/S2 | 240/100 | 0.38 | 135 | do |

In Table 2, kinds of the phenol compound and solvent are as follows.

Phenol compound:
a-1: a compound represented by the above formula (4-1)
a-2: a compound represented by the above formula (4-5)
a-3: a compound represented by the above formula (4-7)
α and β are defined as in Table 1.
γ: a compound represented by the following formula (4):

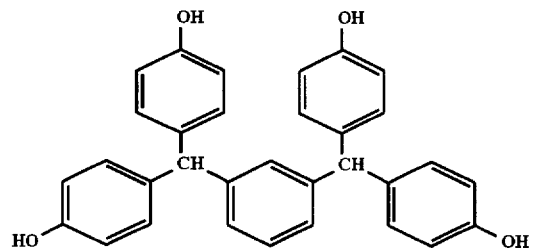

Solvent:
S1 an S2 are defined as in Table 1.

As is evident from the above Examples 11 to 14, a resist having excellent developability, high resolution and significantly improved focus latitude can be obtained from the second radiation sensitive resin composition of the present invention. Therefore, the radiation sensitive resin composition of the present invention can be suitably used as a resist for producing highly integrated circuits.

What is claimed is:

1. A radiation sensitive resin composition comprising an alkali soluble resin and a 1,2-quinonediazide compound selected from the group consisting of 1,2-napthoquinonediazide-5-sulfonates of compounds represented by formulas (4-1), (4-2), (4-5) and (4-7):

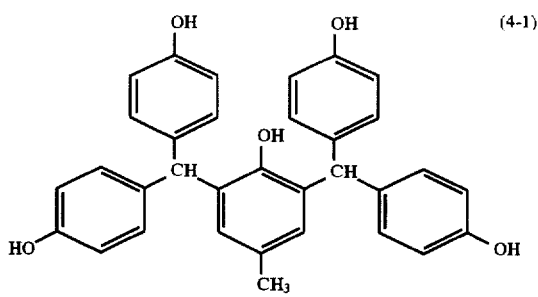

-continued

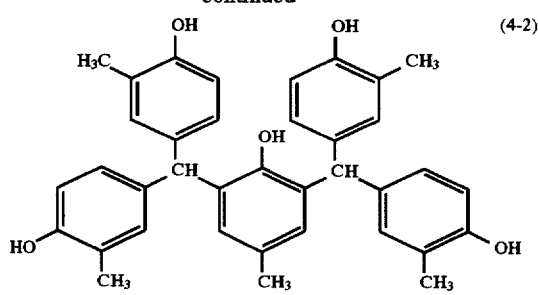

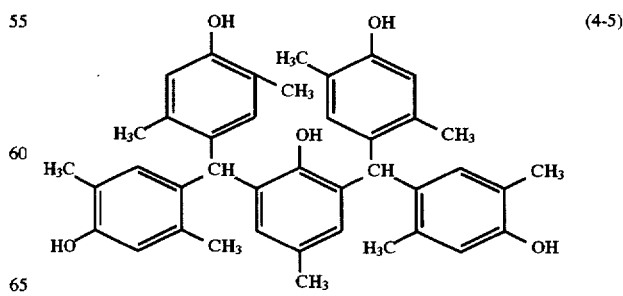

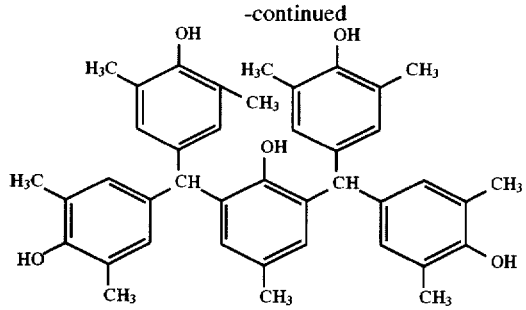

2. A radiation sensitive resin composition comprising an alkali soluble resin and a 1,2-quinonediazide compound selected from the group consisting of 1,2-quinonediazide compounds represented by formulas (4-1-A), (4-2-A), (4-5-A) or (4-7-A):

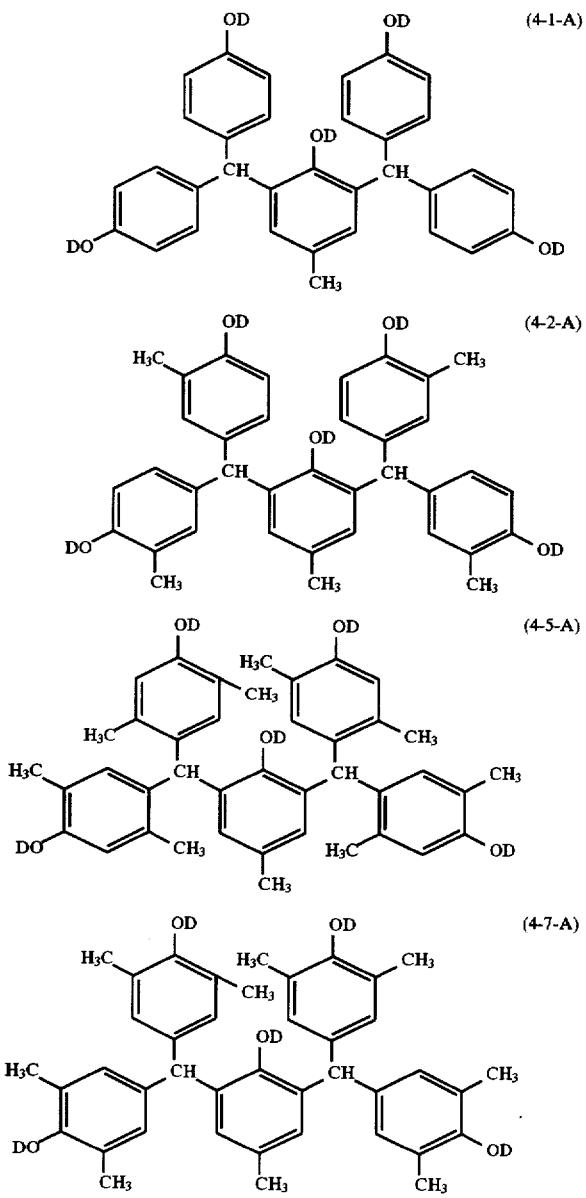

wherein D is a hydrogen atom or a 1,2-quinonediazide-sulfonyl moiety, provided that at least one of the D's in the moieties represented by -OD of each formula is an organic group containing a 1,2-quinonediazide-sulfonyl moiety.

3. The radiation sensitive resin composition of claim 2, wherein said 1,2-quinonediazide-sulfonyl moiety is selected from the group consisting of a 1,2-benzoquinonediazide-4-sulfonyl moiety, a 1,2-naphthoquinonediazide-4-sulfonyl moiety, a 1,2-naphthoquinonediazide-5-sulfonyl moiety and a 1,2-naphthoquinonediazide-6-sulfonyl moiety.

4. The radiation sensitive resin composition of claim 2, wherein the 1,2-quinonediazide compound is preparable by a reaction between a compound (1B) and a 1,2-quinonediazide-sulfonyl chloride, wherein the compound (1B) is selected from the group consisting of compounds represented by the following formulas (4-1), (4-2), (4-5) or (4-7):

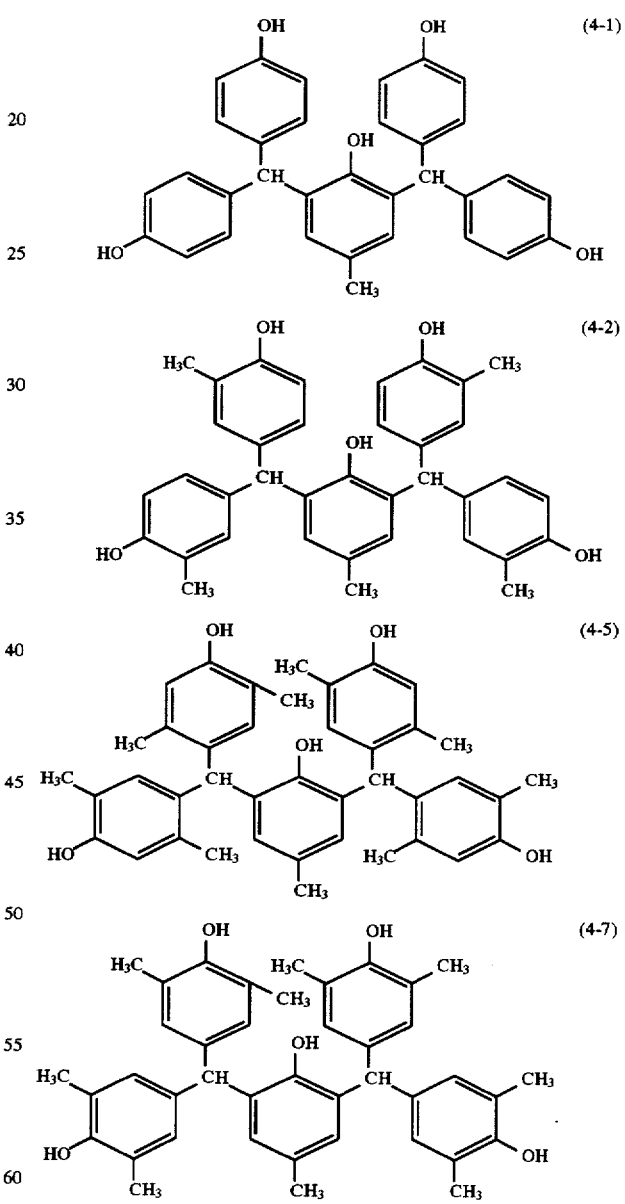

5. The radiation sensitive resin composition of claim 2, wherein the alkali soluble resin is selected from the group consisting of novolak resins, polyvinyl phenols and derivatives thereof, styrene-maleic anhydride copolymers and derivatives thereof, polyvinyl hydroxy benzoates, and carboxyl group-containing methacrylic acid resins.

6. The radiation sensitive resin composition of claim 2, further comprising a low molecular weight phenol compound as a dissolution promoter of the alkali soluble resin.

7. The radiation sensitive resin composition of claim 6, wherein the low molecular weight phenol is selected from the group consisting of compounds represented by the following formulas (3-1) to (3-9):

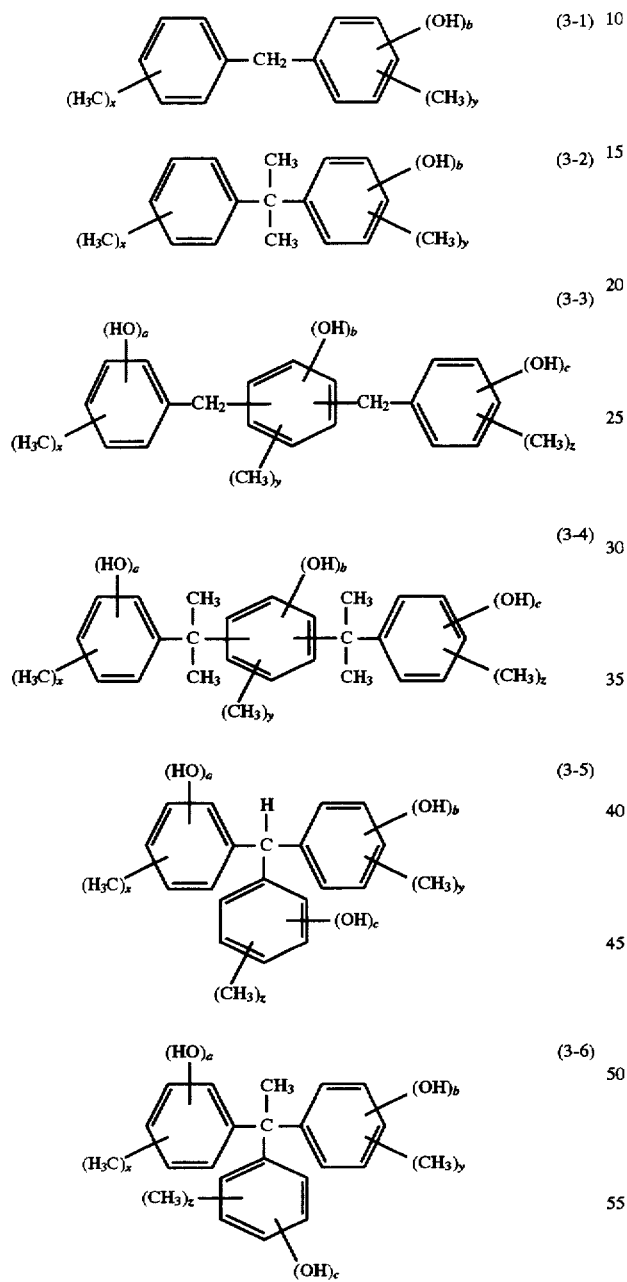

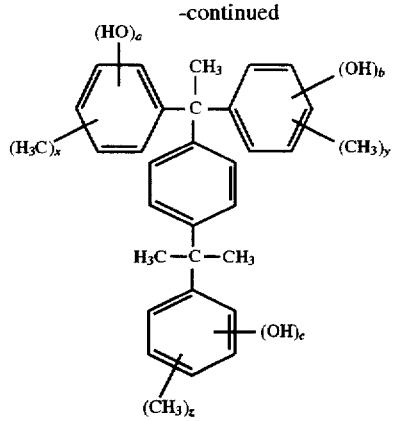

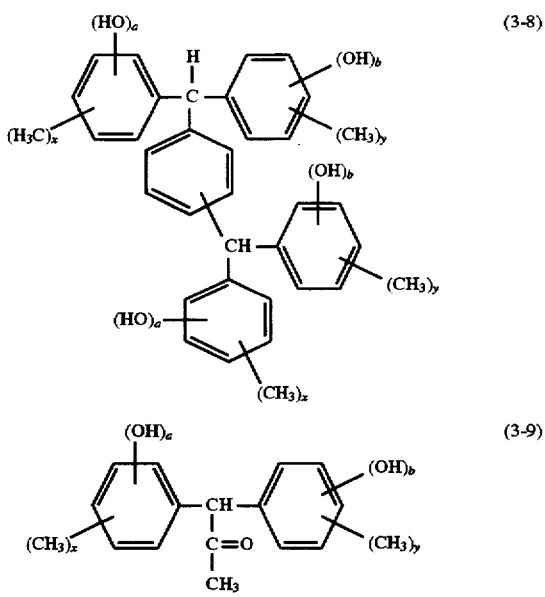

wherein (3-1) to (3-9), a, b and c are each a numeral of 0 to 3, excluding where all are 0, and x, y and z are each a numeral of 0 to 3, a+x≦5, and in (3-1), (3-2) and (3-5) to (3-9) b+y≦5, and in (3-3) and (3-4) b+y≦4 and c+z≦5.

8. The radiation sensitive resin composition of claim 2, wherein the composition further comprising a second 1,2-quinonediazide compound.

9. The radiation sensitive resin composition of claim 8, wherein the second 1,2-quinonediazide compound is at least one compound selected from the group consisting of 1,2-quinonediazide sulfonates of 2,3,4-trihydroxybenzophenone, 2,3,4,4'-tetrahydroxybenzophenone, 2,3,4,2',4'-pentahydroxybenzophenone, tris(4-hydroxyphenyl) methane, 1,3,5-tris(4-hydroxy-α,α-dimethylbenzyl) benzene, 1,1-bis(4-hydroxyphenyl)-1-(4-{1-(4-hydroxyphenyl)-1-methylethyl}phenyl)ethane, 2-(3,4-dihydroxyphenyl)-2-(4-hydroxyphenyl)propane, 1-phenyl-1,3,3-tris(2,5-dimethyl-4-hydroxyphenyl)propane, 4,6-bis{1-(4-hydroxyphenyl)-1-methylethyl}-1,3- dihydroxybenzene and 2,4,4-trimethyl-2-(2,4-dihydroxyphenyl)-7-hydroxychroman.

10. The radiation sensitive resin composition of claim 2, wherein the total amount of the 1,2-quinonediazide sulfonyl residue of said 1,2-quinonediazide compound is adjusted to 5 to 50% weight, based on the total solid content of the composition.

11. The radiation sensitive resin composition of claim 2, wherein the 1,2-quinonediazide compounds is used in an amount of 5 to 50 parts by weight, based on 100 parts by weight of the alkali soluble resin.

12. The radiation sensitive resin composition of claim 6, wherein an amount of the low weight phenol compound used is 50 parts or less by weight based on 100 parts by weight of the alkali soluble resin.

* * * * *

UNITED STATES PATENT AND TRADEMARK OFFICE
CERTIFICATE OF CORRECTION

PATENT NO. : 5,798,201
DATED : August 25, 1998
INVENTOR(S) : Katsumi INOMATA, et al.

It is certified that error appears in the above-identified patent and that said Letters Patent is hereby corrected as shown below:

On the title page, Item [30], the Foreign Application Priority Data, is missing. It should read:

--Oct. 5, 1994    [JP]    Japan.............6-241144--
--Oct. 5, 1994    [JP]    Japan.............6-241145--

Signed and Sealed this

Ninth Day of March, 1999

Attest:

Q. TODD DICKINSON

*Attesting Officer*    *Acting Commissioner of Patents and Trademarks*